(12) United States Patent
Tsukamoto (10) Patent No.: US 8,829,794 B2
(45) Date of Patent: Sep. 9, 2014

(54) VEHICLE LAMP

(71) Applicant: Hironori Tsukamoto, Shizuoka (JP)

(72) Inventor: Hironori Tsukamoto, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 105 days.

(21) Appl. No.: 13/705,613

(22) Filed: Dec. 5, 2012

(65) Prior Publication Data

US 2013/0140986 A1 Jun. 6, 2013

(30) Foreign Application Priority Data

Dec. 6, 2011 (JP) ................. 2011-266642

(51) Int. Cl.
*B60Q 1/14* (2006.01)

(52) U.S. Cl.
USPC ............... 315/77; 315/82; 315/294; 315/307; 315/312; 362/475; 362/545; 362/240; 362/249.02

(58) Field of Classification Search
CPC .. H05B 33/0824; H05B 33/0833; B60Q 1/04; B60Q 1/0017; B60Q 1/2665; F21S 48/10; F21S 48/21; F21S 48/215
USPC ...................... 315/77, 82, 294, 307, 308, 312; 362/475, 485, 487, 543–545, 227, 362/249.02, 236, 240
See application file for complete search history.

(56) References Cited

U.S. PATENT DOCUMENTS

| | | | | |
|---|---|---|---|---|
| 6,441,943 B1* | 8/2002 | Roberts et al. | ................ | 359/267 |
| 7,274,150 B2* | 9/2007 | Takeda et al. | ................... | 315/77 |
| 7,397,068 B2* | 7/2008 | Park et al. | ........................ | 257/88 |
| 7,646,029 B2* | 1/2010 | Mueller et al. | ................... | 257/84 |
| 7,812,551 B2* | 10/2010 | Hite et al. | ...................... | 315/291 |
| 8,100,552 B2* | 1/2012 | Spero | ............................. | 362/231 |
| 2009/0134422 A1* | 5/2009 | Sah | ................................ | 257/99 |
| 2012/0326632 A1* | 12/2012 | Kitagawa | ...................... | 315/307 |
| 2013/0241408 A1* | 9/2013 | Sasaki et al. | ..................... | 315/50 |

FOREIGN PATENT DOCUMENTS

JP 2003115208 A 4/2003

* cited by examiner

*Primary Examiner* — Haiss Philogene
(74) *Attorney, Agent, or Firm* — Sughrue Mion, PLLC (57) ABSTRACT

A vehicle lamp include san LED package as a light source. The LED package includes a first series element section having a plurality of LED elements connected in series with each other, a second series element section having at least one LED element, the number of which is smaller than the number of LED elements of the firs series element section, a first anode electrode provided on an anode side of the first series element section, a first cathode electrode provided on a cathode side of the first series element section, a second anode electrode provided on an anode side of the second series element section, and a second cathode electrode provided on a cathode side of the second series element section.

7 Claims, 10 Drawing Sheets

VEHICLE LAMP

CROSS-REFERENCE TO RELATED APPLICATION(S)

The present application claims the benefit of priority of Japanese Patent Application No. 2011-266642, filed on Dec. 6, 2011. The disclosures of the application are incorporated herein by reference.

BACKGROUND

1. Technical Field

The present disclosure relates to a vehicle lamp and more particularly to a vehicle lamp that uses an LED package in which a plurality of LED elements are mounted as a light source.

2. Related Art

There are known vehicle lamps that use an LED element represented by a light emitting diode as a light source (for example, refer to Patent Literature 1). An LED element has an advantage that both consumed power and calorific power are largely suppressed to low levels compared with, for example, a bulb light source. On the other hand, with the LED element, since a quantity of light per chip is small, a number of LED elements corresponding to a quantity of light required of a light source are packaged for use as a light source.

RELATED ART LITERATURE

Patent Literature

[Patent Literature] JP-A-2003-115208

Incidentally, a single lamp unit may be commonized for use as a tail lamp and a stop lamp, for example, from the reason that the cost requires a reduction in the number of components or the design requires such commonization. However, as to a light source for such a commonized lamp unit, LED packages are provided separately for use for tail lamp and stop lamp lighting modes. Each LED package includes a number of LED elements that enables the lamp unit to emit light with a quantity of light required as the stop lamp or the tail lamp. As to vehicle lamps such as headlamps or tail lamps which have their own unchanging applications, depending on where to be used, there are situations in which for example, the European and US regulations require different quantities of light for use in Europe and the US, respectively. In this case, separate LED packages need to be designed which install different numbers of LED elements according to quantities of light that required by the regulations of the countries where the vehicle lamps are used.

SUMMARY

A vehicle lamp according to an exemplary embodiment of the invention comprises:

an LED package as a light source, wherein
the LED package comprises:
a first series element section having a plurality of LED elements connected in series with each other;
a second series element section having at least one LED element, the number of which is smaller than the number of LED elements of the firs series element section;
a first anode electrode provided on an anode side of the first series element section;
a first cathode electrode provided on a cathode side of the first series element section;
a second anode electrode provided on an anode side of the second series element section; and
a second cathode electrode provided on a cathode side of the second series element section.

According to the vehicle lamp described above, by including the LED package that includes the two systems of LED elements which are connected in series, the first series element section and the second series element section which are provided within the single LED package are allowed to emit light separately as two types of light sources having different quantities of light. In addition, by mounting the LED package on the substrate on which the conductive patterns are formed by which the first cathode electrode and the second anode electrode of the LED package are electrically connected with each other and the first anode electrode and the second cathode electrode of the LED package are electrically connected with the positive electrode and the negative electrode of the power supply, the LED package can be used as a light source in which the LED elements of the first series element section and the LED element of the second series element section are connected in series with each other to thereby produce a large quantity of light.

The vehicle lamp may further comprise:
a substrate on which the LED package is mounted, wherein
the substrate comprises a first conductive pattern by which the first anode electrode is electrically connected with a positive electrode of a power supply, a second conductive pattern by which the second anode electrode is electrically connected with the positive electrode of the power supply, a third conductive pattern by which the first cathode electrode is electrically connected with a negative electrode of the power supply, and a fourth conductive pattern by which the second cathode electrode is electrically connected with the negative electrode of the power supply.

By adopting this configuration, the first series element section and the second series element section that are provided within the LED package can emit light separately as two types of light sources having different quantities of light.

The vehicle lamp may further comprise:
a control circuit configured to control a connection of the first series element section and the second series element section with the power supply according to respective lighting modes of a tail lamp and a stop lamp, wherein
the control circuit connects the second series element section with the power supply in the lighting mode corresponding to the tail lamp and connects the first series element section or the first series element section and the second series element section with the power supply in the lighting mode corresponding to the stop lamp.

By adopting this configuration, the LED package can emit light with quantities of light which correspond to the respective lighting modes of the tail lamp and the stop lamp.

The vehicle lamp may further comprise:
a substrate on which the LED package is mounted, wherein
the substrate comprises a first conductive pattern by which the first anode electrode is electrically connected with a positive electrode of a power supply, a second conductive pattern by which the second cathode electrode is electrically connected with a negative electrode of the power supply, and a third conductive pattern by which the first cathode electrode and the second anode electrode are electrically connected with each other.

By adopting this configuration, the LED package can emit light as a light source in which the LED elements of the first series element section and the second series element section are connected in series with each other to thereby produce a larger quantity of light.

The first series element section may include three LED elements, and the second series element section may include one LED element.

These four LED elements may each have a square or rectangular external shape when seen from the top, and in the LED package, the four LED elements may be disposed to lie close to each other so as to have a substantially square external shape in whole when seen from the top.

By adopting this configuration, the LED package can be made smaller in size, and the illuminance of the light emitting surface of the LED package can be increased further.

The invention is not limited to the forms that are described heretofore as its characteristics, and hence, sub-combinations of these characteristics are also included in the invention.

DETAILED DESCRIPTION

Hereinafter, referring to the accompanying drawings, a preferred embodiment of the invention will be described.

Figure 1:
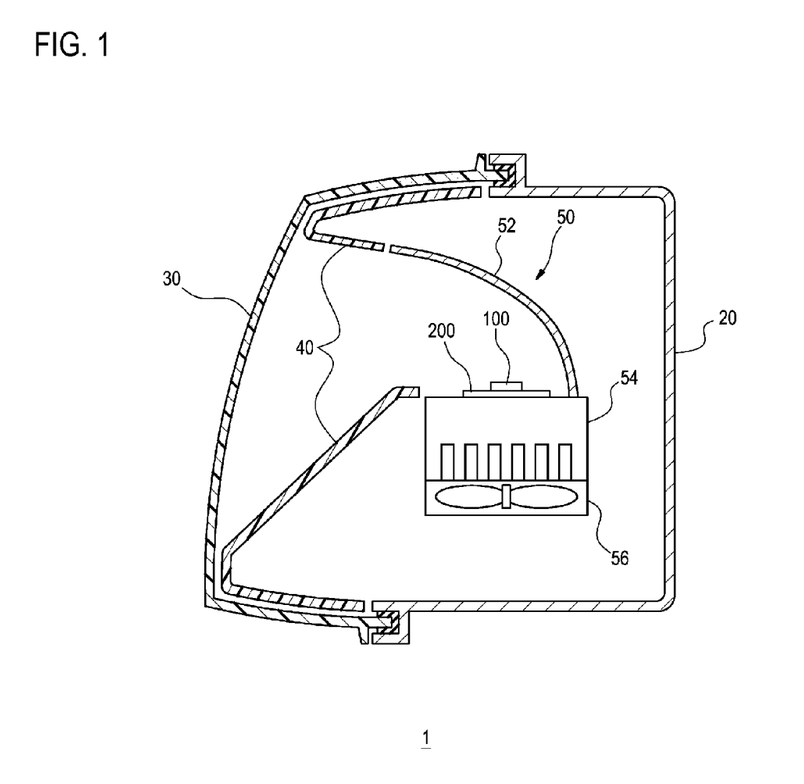
FIG. 1 is a vertical sectional view of a vehicle lamp according to an embodiment of the invention.

FIG. 1 is a vertical sectional view of a vehicle lamp 1 according to an embodiment of the invention.

The vehicle lamp 1 according to this embodiment is a so-called tail and stop lamp that is mounted at a rear end portion of a vehicle such as a passenger vehicle. This tail and stop lamp has a function not only to enhance the visibility from a vehicle that follows the subject vehicle but also to let it known to the following vehicle that the brakes are being applied in the subject vehicle by being lit with a larger quantity of light when the brakes are applied. Consequently, in the following description, the "front of the lamp" means substantially the rear of the vehicle.

As shown in FIG. 1, in the vehicle lamp 1, a light source unit 50 is accommodated in a lamp chamber that is defined by a lamp body 20 and a transparent light transmissive cover 30 that is mounted on the lamp body 20 so as to cover an opening provided at the front of the lamp body 20. Additionally, when looking at the lamp chamber through the light transmissive cover 30 from the outside thereof, a peripheral portion of the light source unit 50 that lies at the front of the lamp is covered by an extension 40, excluding a central portion from which light is emitted.

As shown in FIG. 1, the light source unit 50 includes an LED package 100 that is a light source of the vehicle lamp 1, a substrate 200 on which the LED package 100 is mounted, a reflector 52 that reflects light from the LED package 100 to the front of the lamp, a heat sink 54 that is disposed underneath the substrate 200 to fixedly hold the substrate 200 and a radiator fan 56 that is disposed below the heat sink 54 to be fixedly held to the heat sink 54. This light source unit 50 is fixed to the lamp body 20 via a bracket and an aiming mechanism for adjusting an irradiation optical axis of the light source unit 50, both the bracket and the aiming mechanism being not shown.

The heat sink 54 is formed of a metallic material having superior heat conductivity such as an aluminum alloy, for example. A plurality of heat dissipating fins are provided at a lower portion of the heat sink 54 to dissipate heat generated from the LED package 100 and the substrate 200 with good efficiency. Then, heat dissipated from the heat sink 54 is dispersed by streams of air produced by the radiator fan 56.

The reflector 52 is a substantially dome-shaped member in which for example, an inner surface configuration of a vertical sectional plane exhibits an ellipse. An inner surface configuration along a sectional plane shown in FIG. 1 is part of an ellipse having a first focal point near a light emitting surface of the LED package 100 and a second focal point between the extension 40 and the light transmissive cover 30 within the lamp chamber. Note that the shape of the reflector 52 is not limited to that of this embodiment. A reflector to be used preferably at least reflects light from the LED package 100 to the front of the lamp in a diffusing fashion.

Figure 2:
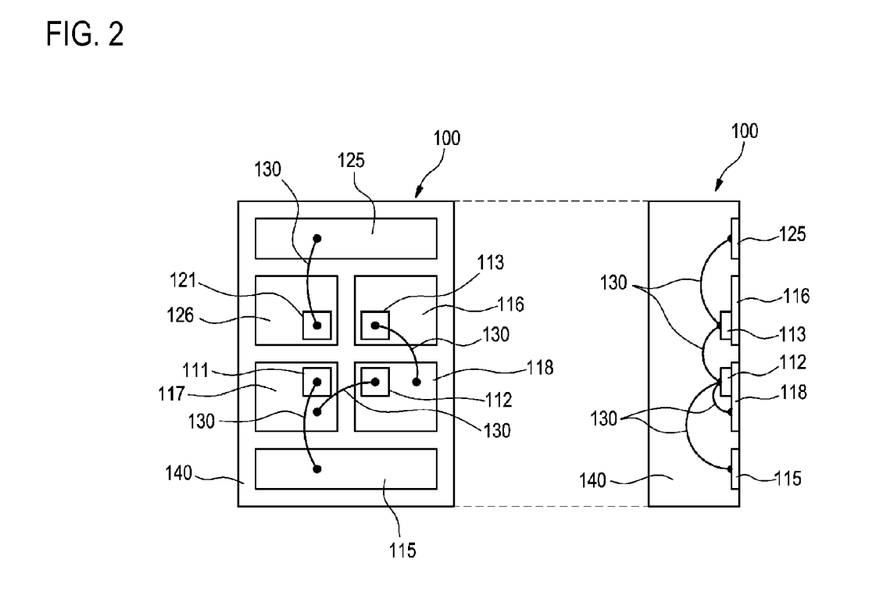
FIG. 2 is a plan and side view of an LED package as light source of the vehicle lamp.

FIG. 2 shows a plan view and a side view of the LED package 100. As shown in FIG. 2, the LED package 100 has six electrodes 115, 116, 117, 118, 125, 126, four LED elements 111, 112, 113, 121, wires 130 via which the LED elements 111, 112, 113, 121 and the electrodes 116, 117, 118, 126 are connected by wire bonding and a resin package 140 that seals in these constituent components.

As shown in FIG. 2, when seen from the top, the electrodes 116, 117, 118, 126 each have a substantially square shape and are disposed at a central portion of the LED package 100. Additionally, when seen from the top, the electrodes 115, 125 each have a substantially rectangular shape. The electrode 125 is disposed at an upper part of the LED package 100, while the electrode 115 is disposed at a lower part of the LED package 100. All these electrodes 115, 116, 117, 118, 126 are exposed from a surface of the resin package 140, and when the LED package 100 is mounted on the substrate 200, the electrodes 115, 116, 117, 118, 125, 126 are electrically connected to conductive patterns, which will be described later, formed on the substrate 200.

As shown in FIG. 2, when seen from the top, the LED elements 111, 112, 113, 121 are chips having a substantially square external shape and are fixed one by one to the electrodes 116, 117, 118, 126. In particular, in this embodiment, the LED elements 111, 112, 113, 121 are disposed so as to lie close to each other on surfaces of the electrodes 116, 117, 118, 121 in such a manner as to constitute in whole a substantially square external shape when seen from the top, that is, in such a manner that light emitting surfaces of the LED elements 111, 112, 113, 121 are seen in whole as a single quadrangular shape.

The wire 130 connects electrically the LED element 113 disposed on the electrode 116 with the electrode 118 and the wire 130 connects electrically the LED element 112 disposed on the electrode 118 with the electrode 117. Additionally, the wire 130 connects electrically the LED element 111 disposed on the electrode 117 with the electrode 115, and the wire 130 connects electrically the LED element 121 disposed on the electrode 126 with the electrode 125.

Based on the electrical configuration described above, the three LED elements 111, 112, 113 in the LED package 100 make up a first series element section 110 in which the LED elements 111, 112, 113 are connected in series with each other with the electrode 115 and the electrode 116 functioning, respectively, as an anode electrode (a first anode electrode) and a cathode electrode (a first cathode electrode). The LED element 121 makes up a second series element section 120 in which the electrode 125 and the electrode 126 function, respectively, as an anode electrode (a second anode electrode) and a cathode electrode (a second cathode electrode).

Figure 3:
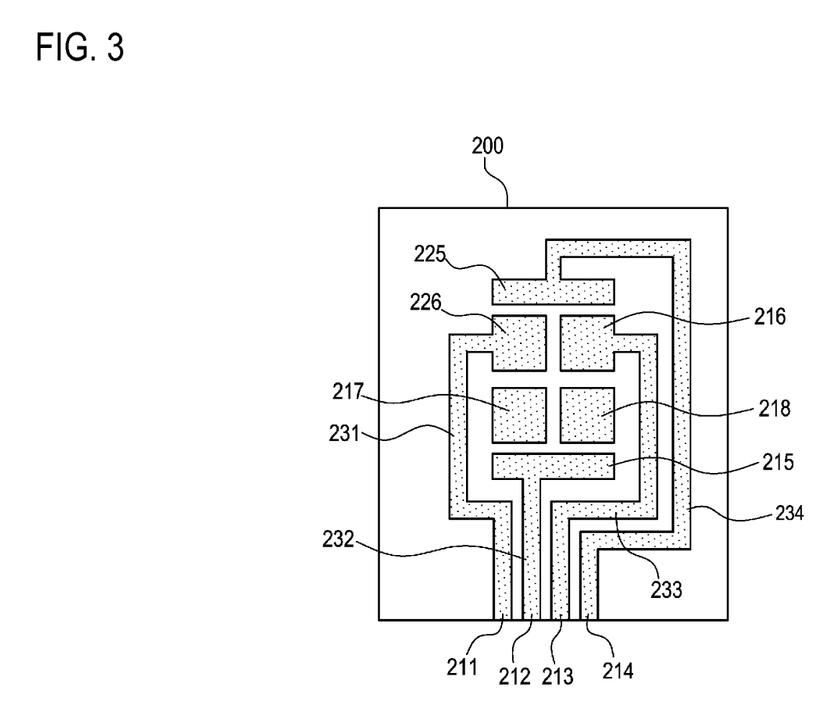
FIG. 3 is a plan view of a substrate on which the LED package is mounted.
Figure 4:
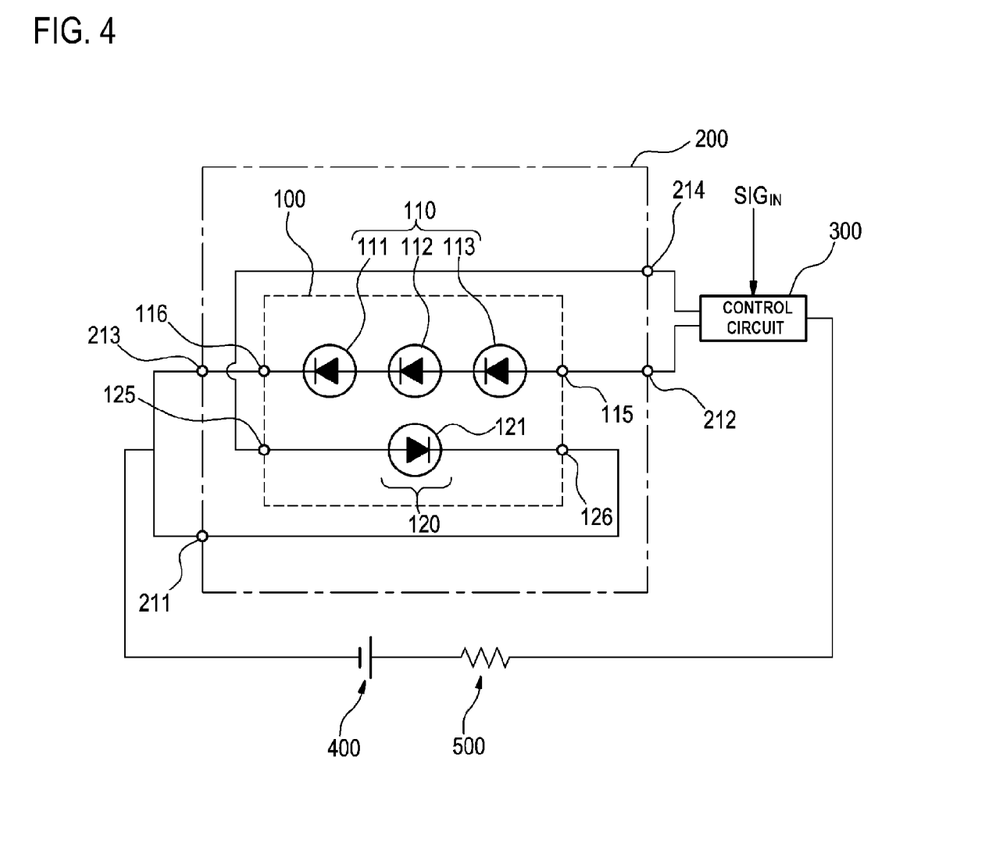
FIG. 4 is a circuit diagram of a lighting circuit of the vehicle lamp including the LED package and the substrate.

FIG. 3 is a plan view of the substrate 200 on which the LED package 100 is mounted. Additionally, FIG. 4 is a circuit diagram of a lighting circuit of the vehicle lamp 1 including the LED package 100 and the substrate 200. As shown in FIG. 3, terminal portions 211, 212, 213, 214, electrode portions 215, 216, 217, 218, 225, 226 and wiring portions 231, 232, 233, 234 are formed on the substrate 200 as conductive patterns. For example, a glass epoxy substrate is preferably used for the substrate 200.

The electrode portions 215, 126, 217, 218, 225, 226 are formed in positions where they are brought into abutment with the electrodes 115, 116, 117, 118, 125, 126 of the LED package 100, respectively when the LED package 100 is mounted on the substrate 200. In addition, the electrode portion 226 is electrically connected with the terminal portion 211 via the wiring portion 231. Similarly, the electrode portions 215, 216, 225 are electrically connected with the terminal portions 212, 213, 214 via the wiring portions 232, 233, 234, respectively.

In the lighting circuit of the vehicle lamp 1, the LED package 100 is mounted on the substrate 200 that has the electrical configuration described above. Additionally, the terminal portions 212, 214 of the substrate 200 are electrically connected with a positive electrode of a power supply 400, while the terminal portions 211, 213 of the substrate 200 are electrically connected with a negative electrode of the power supply 400. Consequently, as shown in FIG. 4, the electrode 115 (the first anode electrode) and the electrode 125 (the second anode electrode) of the LED package 100 are electrically connected with the positive electrode of the power supply 400, while the electrode 116 (the first cathode electrode) and the electrode 126 (the second cathode electrode) are electrically connected with the negative electrode of the power supply 400. Namely, the first series element section 110 that is made up of the LED elements 111, 112, 113 and the second series element section 120 that is made up of the LED element 121 are connected in parallel with respect to the power supply 400.

In addition, as shown in FIG. 4, in the lighting circuit of the vehicle lamp 1, a resistance 500 and a control circuit 300 are provided on a positive electrode side of the power supply 400. The resistance 500 is a current controlling resistance that is provided to prevent a current that flows to the LED elements that emit light by an output voltage of the power supply 400 from exceeding a rated value. Although the power supply 400 may be a direct current power supply such as a normal onboard battery, a power supplying battery may be used for the power supply 400 in an electric vehicle. Additionally, the device for controlling the current value is not limited to the resistance 500 used in this embodiment, and hence, an inverter circuit may be used therefore.

The control circuit 300 controls the connection between the first series element section 100 and the second series element section 120 with the power supply 400 in accordance with the contents of an input signal ($SIG_{IN}$). More specifically, in the case of the vehicle lamp 1 being a commonized lamp for a tail lamp and a stop lamp, the control circuit 300 causes the LED element 121 of the second series element section 120 to emit light by connecting the electrode 125 (the second anode electrode) of the second series element section 120 with the positive electrode of the power supply 400 in the case of the input signal ($SIG_{IN}$) being, for example, a signal indicating that a tail lamp switch is switched on by the driver or that the vehicle lamp 1 should irradiate with light as the tail lamp.

In addition, the control circuit 300 causes the LED elements 111, 112, 113 of the first series element section 110 to emit light by connecting the electrode 115 (the first anode electrode) of the first series element section 110 with the positive electrode of the power supply 400 in the case of the input signal ($SIG_{IN}$) being, for example, a signal indicating that a brake pedal is depressed by the driver or that the vehicle lamp 1 should irradiate with light as the brake lamp. Additionally, as this occurs, although the control circuit 300 may cause the second series element section 120 to emit light together with the first series element section 110, as this occurs, it is preferable that the value of current that flows to the LED elements 111, 112, 113 of the first series element section 110 and the value of current that flows to the LED element 121 of the second series element section 120 can be set so as to become equal to each other.

Figure 5:
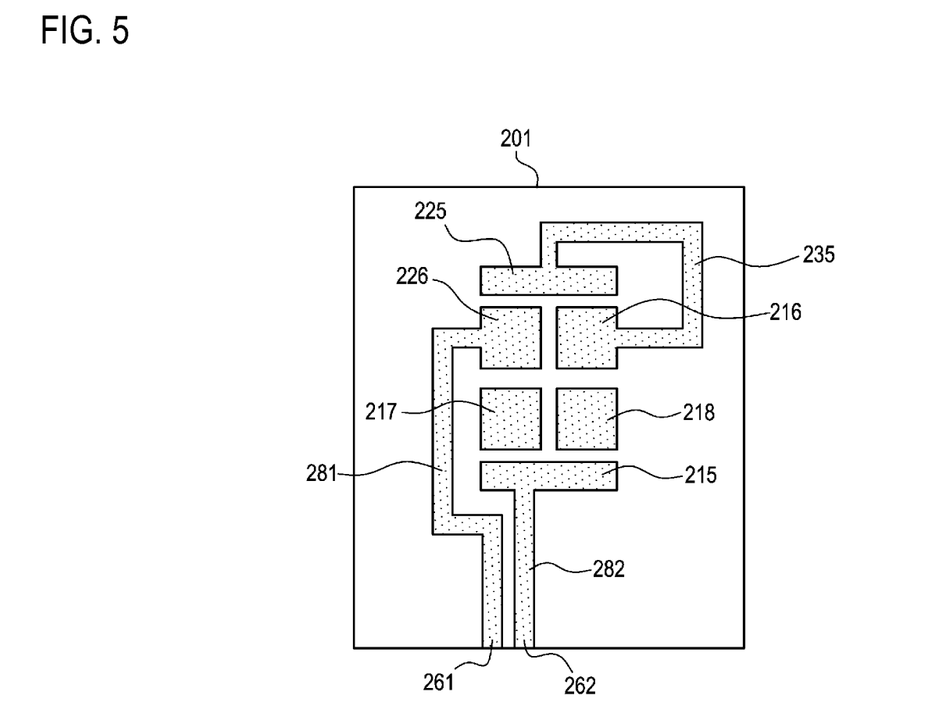
FIG. 5 is a plan view of a substrate on which the LED package is mounted.
Figure 6:
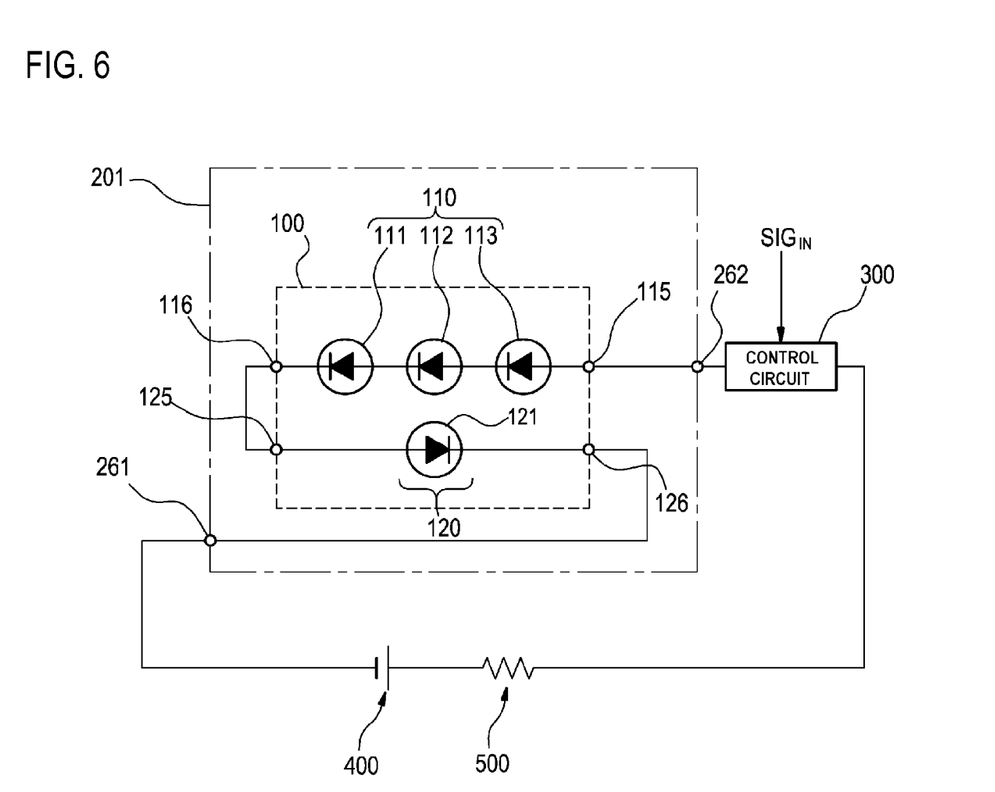
FIG. 6 is a circuit diagram of a lighting circuit of the vehicle lamp including the LED package and the substrate.

FIG. 5 is a plan view of a substrate 201 on which the LED package 100 is mounted. Additionally, FIG. 6 is a circuit diagram of a lighting circuit of the vehicle lamp 1 including the LED package 100 and the substrate 201. In the substrate 201 shown in FIG. 5, like reference numerals will be given to configurations like to those of the substrate 200 that have been described by reference to FIG. 3 before, and the description thereof will be omitted as required.

As shown in FIG. 5, terminal portions 261, 262 and wiring portions 235, 281, 282 are formed as conductive patterns on the substrate 201 in place of the terminal portions 211, 212, 213, 214 and the wiring portions 231, 232, 233, 234 of the substrate 200. Additionally, electrodes 215, 216, 217, 218, 225, 226 which are similar to those of the substrate 200 are formed as conductive patterns on the substrate 201.

Then, in the substrate 201, the electrode 216 is electrically connected with the electrode 225 via the wiring portion 235. Additionally, the electrode portion 226 is electrically connected with the terminal portion 261 via the wiring portion 281. Similarly, the electrode portion 215 is electrically connected with the terminal portion 262 via the wiring portion 282. Note that the terminals 261, 262 and the wiring portions 281, 282 may be formed as conductive patterns having the same configurations as the conductive patterns of the terminal portions 211, 212 and the wiring portions 231, 232 of the substrate 200.

Consequently, when the substrate 201 is used as a circuit board for the lighting circuit of the vehicle lamp 1, as shown in FIG. 6, the electrode 115 (the first anode electrode) is connected with the positive electrode of the power supply 400 via the control circuit 300, and the electrode 126 (the second cathode electrode) is connected to the negative electrode of the power supply 400, which is similar to where the substrate 200 is used as the circuit board. However, in the substrate 201, the electrode 116 (the first cathode electrode) is electrically connected with the electrode 125 (the second anode electrode), which differs from where the substrate 200 is used. Namely, when the substrate 201 is used for the lighting circuit of the vehicle lamp 1, the LED elements 111, 112, 113 of the first series element section 110 and the LED element 121 of the second series element section 120 are connected in series with respect to the power supply 400.

Consequently, when the vehicle lamp 1 is used as a lamp having only one type of lighting mode or a larger quantity of light is required, by using the substrate 201 of this example, all the LED elements 111, 112, 113, 121 of the LED package 100 can emit light simultaneously.

Thus, as has been described heretofore, in the vehicle lamp 1 of this example, the two series element sections are provided within the LED package 100 which are made up of the first series element section 110 and the second series element section 120 that include the different numbers of LED elements and include the anode and cathode external electrodes. Additionally, by changing the circuit configurations of the substrates on which the LED package 100 is mounted, the element sections can emit light separately or altogether in accordance with a quantity of light required or the number of lighting modes. Consequently, there is no need to design separate LED packages to be mounted so as to match the vehicle lamp 1 with a plurality of lighting modes or the regulations of different countries, thereby making it possible to reduce the part costs.

In addition, in the LED package 100 of this example, the LED elements 111, 112, 113, 121 are disposed so as to lie close to each other so that the external shape of the four LED elements in whole has the substantially square shape when seen from the top. Therefore, the LED package 100 can be made smaller in size, and the illuminance of the light emitting surface of the LED package 100 can be increased further.

Figure 7:
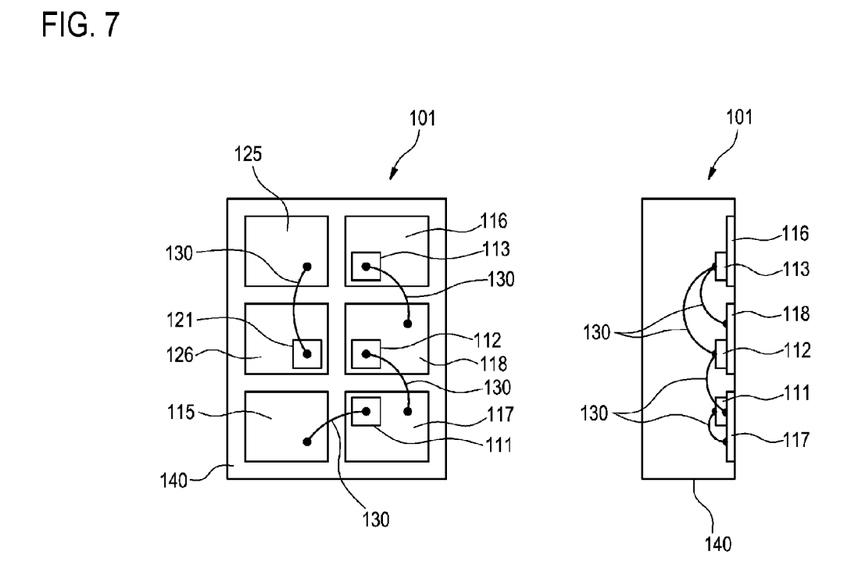
FIG. 7 is a plan and side view of an LED package.
Figure 8:
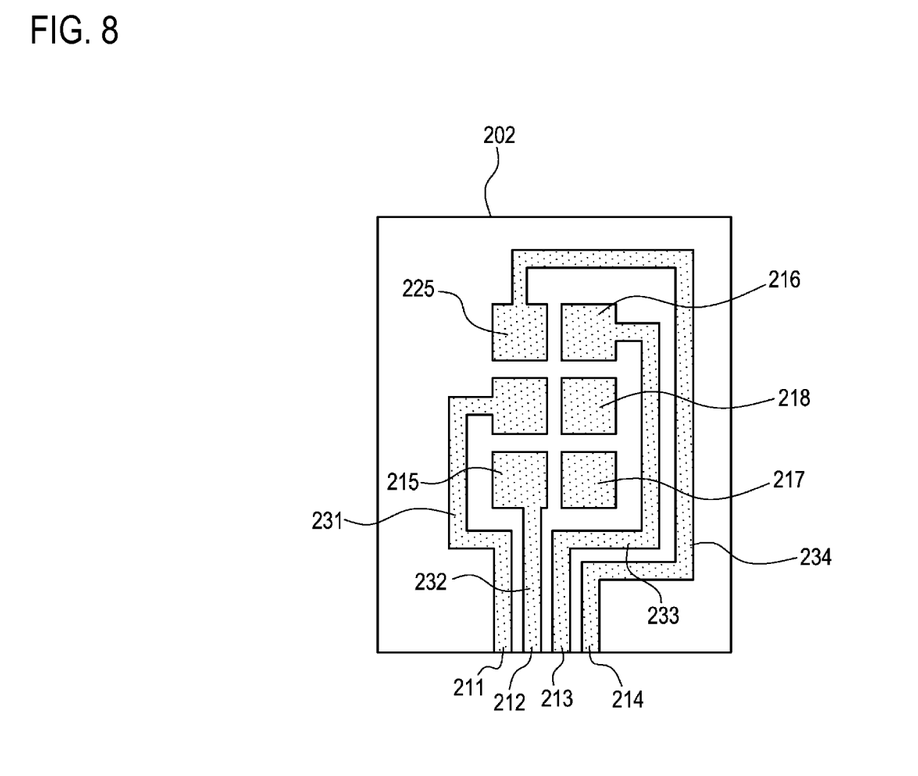
FIG. 8 is a plan view of a substrate on which the LED package is mounted.
Figure 9:
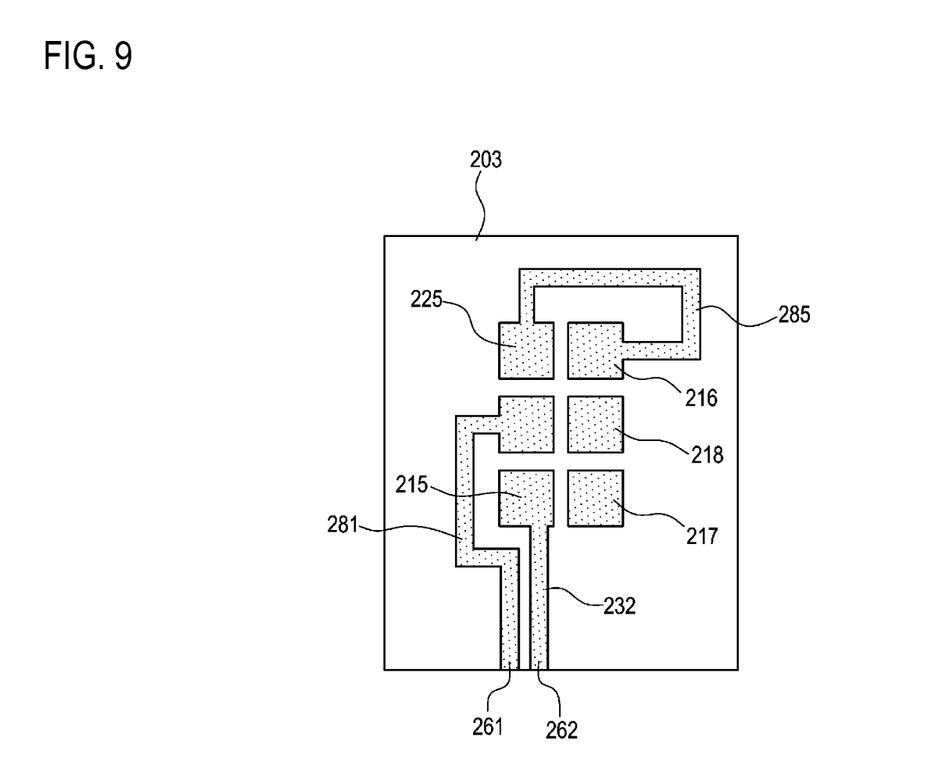
FIG. 9 is a plan view of a substrate on which the LED package is mounted.

FIG. 7 shows a plan view and a side view of an LED package 101. FIG. 8 is a plan view of a substrate 202 on which the LED package 101 is mounted. In the LED package 101 shown in FIG. 7, like reference numerals will be given to configurations like to those of the LED package 100 described above, and the description thereof will be omitted as required. In addition, in the substrate 202 shown in FIG. 8, like reference numerals will be given to configurations like to those of the substrates 200, 201, and the description thereof will be omitted as required.

As shown in FIG. 7, the LED package 101 differs from the LED package 100 in the shape of electrodes 115, 125 and the disposition of electrodes 116, 117, 118, 126 to which LED elements 111, 112, 113, 121 are fixed. Namely, as shown in FIG. 7, in the LED package 101 of this example, the electrodes 115, 125 each have a substantially square shape when seen from the top which is the same as the shape of electrodes 116, 117, 118, 126, and the size thereof is also the same as those of the electrodes 116, 117, 118, 126.

When seen from the top, the electrodes 116, 117, 118 to which the LED elements 111, 112, 113 are aligned in a row on a right-hand side of the LED package 101, while the electrode 126 to which the LED element 121 is fixed is sandwiched by the electrode 115 and the electrode 125 while these electrodes 115, 125, 126 are aligned in a row on a right-hand side of the LED package 101.

A lighting circuit that is formed by mounting the LED package 101 on the substrate 202 shown in FIG. 8 is similar to the lighting circuit that includes the LED package 100 and the substrate 200. However, the shape of a light emitting surface of the LED package 101 differs from that of the light emitting surface of the LED package 100. Namely, in the LED package 101, when only a first series element section 110 emits light, when seen in the plan view shown in FIG. 7, the right-hand side of the LED package 101 emits light, whereas when only the second series element section 120 emits light, when seen in the plan view shown in FIG. 7, the left-hand side of the LED package 101 emits light.

In this way, the shape and position of the light emitting surface can be changed so as to suitably match a lamp by changing only the disposition of the LED elements 111, 112, 113, 121 and the electrodes 116, 117, 118, 126 within the LED package 101 without changing the circuit configuration of the lighting circuit. Additionally, as with the LED package 100 described above, in the LED package 101, by mounting a substrate 203 shown in FIG. 3 in place of the substrate 202, a circuit configuration can be realized in which the LED elements 111, 112, 113 of the first series element section 110 and the LED element 121 of the second series element section 120 can be connected in series with respect to the power supply 400.

Figure 10:
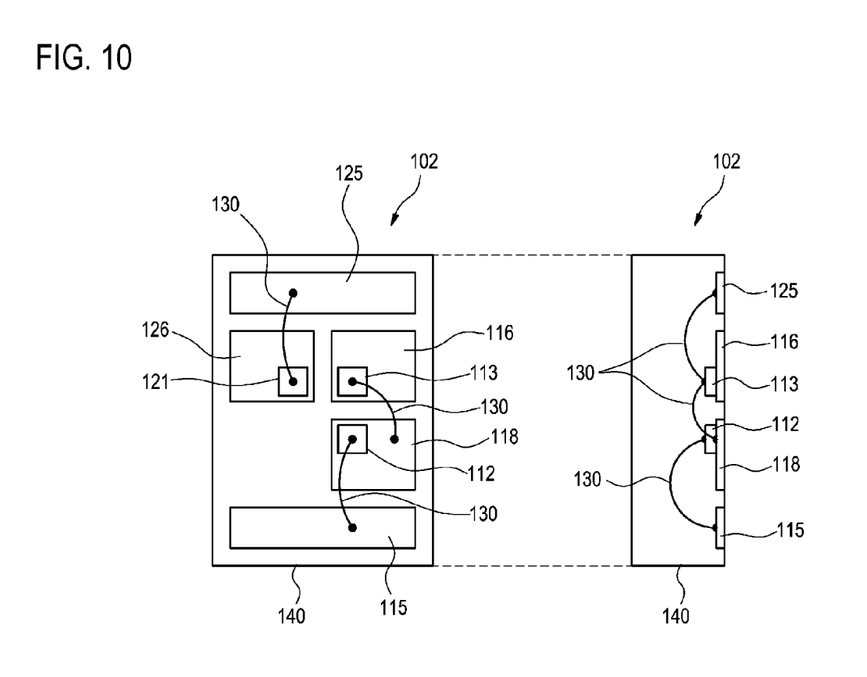
FIG. 10 is a plan and side view of an LED package.

FIG. 10 shows a plan view and a side view of an LED package 102. Also, in the LED package 102 shown in FIG. 10, like reference numerals will be given to configurations like to those of the LED package 100 described above, and the description thereof will be omitted as required.

As shown in FIG. 10, the LED package 102 differs from the LED package 100 in that the electrode 117 and the LED element 111 are not provided. However, the LED package 102 is similar to the LED package with respect to the other configurations. Namely, when compared with the lighting circuit in which the LED package 100 is mounted on the substrate 200, a lighting circuit in which the LED package 102 is mounted on the substrate 200 shown in FIG. 3, for example, differs in that only two LED elements (LED elements 111, 112) are included in the first series element section 110 in the circuit diagram shown in FIG. 4. In this way, it is possible to use the LED package in which the number of LED element mounted is changed without changing the substrates in accordance with a quantity of light required of the vehicle lamp 1.

In the LED packages 100, 101, 102 that are illustrated above, the first series element section 110 includes the two or three LED elements, while the second series element section 120 includes the one LED element. However, the numbers of LED elements that the first series element section 110 and the second series element section 120 include are not limited thereto. In addition, any of the LED packages 100, 101, 102 that are illustrated above is made up of the two systems of series element sections (the first series element section 110 and the second series element section 120). However, the number of series element sections that are provided in the LED package and the numbers of electrodes and terminal portions that are formed on the substrate may be increased according to the number of lighting modes required of the vehicle lamp 1.

The invention has been described above on the basis of each embodiment. However, the invention is not limited to the requirements described in the embodiments. The requirements can be changed without departing from the scope and spirit of the invention and appropriately determined according to the applications thereof.

What is claimed is:

1. A vehicle lamp comprising:
an LED package as a light source, wherein
the LED package comprises:
a first series element section having a plurality of LED elements connected in series with each other;
a second series element section having at least one LED element, the number of which is smaller than the number of LED elements of the firs series element section;
a first anode electrode provided on an anode side of the first series element section;
a first cathode electrode provided on a cathode side of the first series element section;
a second anode electrode provided on an anode side of the second series element section; and
a second cathode electrode provided on a cathode side of the second series element section.

2. The vehicle lamp as set forth in claim 1, further comprising:
   a substrate on which the LED package is mounted, wherein the substrate comprises a first conductive pattern by which the first anode electrode is electrically connected with a positive electrode of a power supply, a second conductive pattern by which the second anode electrode is electrically connected with the positive electrode of the power supply, a third conductive pattern by which the first cathode electrode is electrically connected with a negative electrode of the power supply, and a fourth conductive pattern by which the second cathode electrode is electrically connected with the negative electrode of the power supply.

3. The vehicle lamp as set forth in claim 1, further comprising:
   a control circuit configured to control a connection of the first series element section and the second series element section with the power supply according to respective lighting modes of a tail lamp and a stop lamp, wherein
   the control circuit connects the second series element section with the power supply in the lighting mode corresponding to the tail lamp and connects the first series element section or the first series element section and the second series element section with the power supply in the lighting mode corresponding to the stop lamp.

4. The vehicle lamp as set forth in claim 2, further comprising:
   a control circuit configured to control a connection of the first series element section and the second series element section with the power supply according to respective lighting modes of a tail lamp and a stop lamp, wherein
   the control circuit connects the second series element section with the power supply in the lighting mode corresponding to the tail lamp and connects the first series element section or the first series element section and the second series element section with the power supply in the lighting mode corresponding to the stop lamp.

5. The vehicle lamp as set forth in claim 1, further comprising:
   a substrate on which the LED package is mounted, wherein
   the substrate comprises a first conductive pattern by which the first anode electrode is electrically connected with a positive electrode of a power supply, a second conductive pattern by which the second cathode electrode is electrically connected with a negative electrode of the power supply, and a third conductive pattern by which the first cathode electrode and the second anode electrode are electrically connected with each other.

6. The vehicle lamp as set forth in claim 1, wherein
   the first series element section includes three LED elements; and
   the second series element section includes one LED element, and wherein
   these four LED elements each have a square or rectangular external shape when seen from the top, and in the LED package, the four LED elements are disposed to lie close to each other so as to have a substantially square external shape in whole when seen from the top.

7. The vehicle lamp as set forth in claim 1, wherein
   the second series element section comprises a plurality of LED elements connected in series with each other.

* * * * *